(12) United States Patent
Bouvier et al.

(10) Patent No.: US 12,260,996 B2
(45) Date of Patent: Mar. 25, 2025

(54) ELECTRONIC DEVICE WITH DIFFERENTIAL TRANSMISSION LINES EQUIPPED WITH CAPACITORS SUPPORTED BY A BASE, AND CORRESPONDING MANUFACTURING METHOD

(71) Applicant: Murata Manufacturing Co., Ltd., Nagaokakyo (JP)

(72) Inventors: Stéphane Bouvier, Cairon (FR); David Denis, Bayeux (FR); Emmanuel Lefeuvre, Caen (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 291 days.

(21) Appl. No.: 17/860,308

(22) Filed: Jul. 8, 2022

(65) Prior Publication Data

US 2022/0344100 A1   Oct. 27, 2022

Related U.S. Application Data

(63) Continuation of application No. PCT/IB2021/050120, filed on Jan. 8, 2021.

(30) Foreign Application Priority Data

Jan. 9, 2020   (EP) .................................... 20305013

(51) Int. Cl.
   *H05K 1/16*   (2006.01)
   *H01G 2/06*   (2006.01)
   (Continued)

(52) U.S. Cl.
   CPC ................. *H01G 4/38* (2013.01); *H01G 2/06* (2013.01); *H01G 4/005* (2013.01); *H01G 4/40* (2013.01);
   (Continued)

(58) Field of Classification Search
   CPC ............................. H05K 1/162; H01G 4/385
   See application file for complete search history.

(56) References Cited

U.S. PATENT DOCUMENTS

| 8,373,967 | B2 | 2/2013 | Goetz |
| 10,002,713 | B1 | 6/2018 | Vaughan et al. |

(Continued)

FOREIGN PATENT DOCUMENTS

| CN | 1519869 A | 8/2004 |
| EP | 1170797 A2 | 1/2002 |

(Continued)

OTHER PUBLICATIONS

International Search Report issued for PCT/IB2021/050120, mailed Apr. 30, 2021.

*Primary Examiner* — Jeremy C Norris
(74) *Attorney, Agent, or Firm* — ArentFox Schiff LLP

(57) ABSTRACT

An electronic device and a method for manufacturing an electronic device. The electronic device includes: a board equipped with a pair of differential transmission lines, each line of the pair having an opening extending between two line terminals; and a capacitor module that includes: a base; and two 3D capacitors supported by the base, each 3D capacitor comprising two capacitor terminals respectively connected to the two line terminals of one line of the pair of transmission lines.

15 Claims, 4 Drawing Sheets

(51) Int. Cl.
    *H01G 4/005*   (2006.01)
    *H01G 4/38*    (2006.01)
    *H01G 4/40*    (2006.01)
    *H01L 49/02*   (2006.01)
    *H04B 1/04*    (2006.01)
    *H05K 1/02*    (2006.01)
    *H04L 25/02*   (2006.01)

(52) U.S. Cl.
    CPC ............ H01L 28/90 (2013.01); H04B 1/04 (2013.01); H05K 1/0231 (2013.01); H04L 25/0272 (2013.01)

(56) References Cited

U.S. PATENT DOCUMENTS

| | | | |
|---|---|---|---|
| 10,470,296 B2 | 11/2019 | Miyasaka | |
| 10,475,786 B1 | 11/2019 | Tang et al. | |
| 2002/0003261 A1 | 1/2002 | Murata et al. | |
| 2004/0136141 A1* | 7/2004 | Korony | H01G 4/38 361/306.3 |
| 2006/0131691 A1 | 6/2006 | Roozeboom et al. | |
| 2010/0060390 A1 | 3/2010 | Okada | |
| 2010/0147560 A1* | 6/2010 | Kaneko | H01L 23/13 174/250 |
| 2010/0230787 A1 | 9/2010 | Guiraud et al. | |
| 2011/0309475 A1 | 12/2011 | Lee | |
| 2012/0147579 A1* | 6/2012 | Lee | H05K 1/0295 361/782 |
| 2013/0021115 A1 | 1/2013 | Mooney et al. | |
| 2016/0268144 A1 | 9/2016 | Voiron et al. | |

FOREIGN PATENT DOCUMENTS

| | | |
|---|---|---|
| EP | 1639634 A1 | 3/2006 |
| EP | 2549644 A1 | 1/2013 |
| JP | 2000068714 A | 3/2000 |
| JP | 2013118428 A | 6/2013 |
| KR | 20100034394 A | 4/2010 |
| WO | 2007125510 A2 | 11/2007 |
| WO | 2015063420 A1 | 5/2015 |

* cited by examiner

ELECTRONIC DEVICE WITH DIFFERENTIAL TRANSMISSION LINES EQUIPPED WITH CAPACITORS SUPPORTED BY A BASE, AND CORRESPONDING MANUFACTURING METHOD

CROSS REFERENCE TO RELATED APPLICATIONS

The present application is a continuation of International application No. PCT/IB2021/050120, filed Jan. 8, 2021, which claims priority to European Patent Application No. 20305013.3, filed Jan. 9, 2020, the entire contents of each of which are incorporated herein by reference.

FIELD OF THE INVENTION

The present invention relates to the field of integration and, more particularly, to electronic devices in which differential signals are used.

TECHNICAL BACKGROUND

Many current electronic devices use pairs of wires or lines to transmit complementary signals, in a technique known to the person skilled in the art as differential signaling. Each wire of these pairs of wires conveys a signal which is complementary with the signal received on the other wire.

Such a pair of wires or lines is often called a differential pair, or a pair of differential transmission lines, or a pair of differential transmission wires.

In many devices, it is necessary to provide DC isolation between active circuits connected together and which may use different DC supply voltages.

Typically, discrete capacitors are connected in series between two portions of the wires of the differential pair, one for each differential channel. Multi-layer ceramic capacitors (MLCC) capacitors are generally used in current circuits.

Because of the need for smaller devices, smaller MLCC capacitors are now used. However MLCC capacitors present several drawbacks which will appear more clearly in view of FIGS. 1A and 1B.

FIG. 1A is a schematic perspective view of an example of a device according to the prior art. This device comprises a board 100 which may be a PCB. On this PCB 100, several pairs 101 of differential lines have been printed. Each pair 101 comprises two lines 102 which extend on the surface of the board 100. Each line 102 is equipped with a capacitor 103 connected in series in the middle of the line 102.

It has been observed that while MLCC capacitors can be made in small dimensions, the soldering pads 104 that are used to connect the competitors to the lines 102 limit the number of capacitors that can be connected adjacently in a region of the board such as the board 100. Also, the various rules (such as keepouts, etc.) associated with the manufacturing processes to be used when using MLCC capacitors limit this number of capacitors that can be connected adjacently.

This results from design rules that usually require a critical distance to be respected between adjacent soldering pads such as the soldering pads 104.

Also, on a circuit having several pairs of differential lines, it is usually required that the lines all have the same characteristic impedance, and this usually results in devices where the capacitors are preferably aligned and where there is a gap having a constant gap width between the lines of a pair.

In a pair of differential lines, the lines also have preferably the same length. This results in a large surface area being used, as shown on the figure, where the capacitors are spread in a direction which is substantially orthogonal with the general direction of the current which may circulate in the lines. Also, for a given pair of lines, the gap cannot have a constant gap width because of the constraints of the manufacturing processes that are used.

Because of the thickness of the capacitors 103, it has been observed that parasitic capacitors can appear between the capacitors 103 arranged as seen on the figure. This phenomenon, called parasitic coupling, has an impact on the differential characteristic impedance of a pair.

FIG. 1B is a top view of the device of FIG. 1A.

It is therefore desirable to obtain devices which show limited parasitic coupling between the capacitors, limited surface area occupancy, and which still provide good DC blocking.

From the prior art, documents U.S. Pat. Nos. 8,373,967, 10,470,296, and 10,475,786 disclose known arrangements of capacitors on a pair of differential lines.

The present invention has been made in the light of the above problems.

SUMMARY OF THE INVENTION

The present invention provides an electronic device comprising: a board equipped with a pair of differential transmission lines, each line of the pair having an opening extending between two line terminals; and a capacitor module comprising: a base; and two 3D capacitors supported by the base, each 3D capacitor comprising two capacitor terminals respectively connected to the two line terminals of one line of the pair of transmission lines.

The inventors of the present invention have observed that by using 3D capacitors, it is possible to reduce the dimensions of the overall device while maintaining good capacitance values.

The two 3D capacitors, arranged using the base, here a single base, which will support them, can be arranged closer to each other and more particularly closer to each other with respect to two discrete 3D capacitors. The use of a single base for two 3D capacitors will also facilitate manipulating and connecting the two capacitors, for example in a single step. In fact, there are fewer assembly steps required such as pick and place steps and positioning steps.

For example, a 3D capacitor comprises functional electrodes presenting a relief (for example they comprise a surface presenting a relief or they are formed on a relief such as a pore, a hole, a trench, or a pillar). 3D capacitors may also be defined as comprising functional electrodes extending in three directions orthogonal with each other (for example two directions parallel to the base and one direction orthogonal with the base). In the invention a functional electrode is an electrode which faces the other electrode of the capacitor and participates to the capacitance of the device. The capacitor terminals may be included in the functional electrodes, partially included in the functional electrodes, or may be connected to the functional electrodes. A functional electrode extending in the three directions is a functional electrode having an outer surface extending in these three directions.

It should be noted that by supported by the base, it is meant that the two 3D capacitors may be formed in the base or on the base.

According to a particular embodiment, the 3D capacitors comprise electrodes arranged so as to form 3D structures having dimensions smaller than 200 micrometers between two parallel portions.

For example, the two parallel portions may be the parallel walls of a trench, two opposite walls of a pillar or of a hole, two diametrically opposed walls of a pore. These examples are examples of vertical parallel portions of functional electrodes of the 3D capacitors and these examples may be separated by a distance of less than 10 micrometers.

Also, the two parallel portions may be the top portion and the bottom portion of a trench/pore/hole/pillar. These examples are examples of horizontal parallel portions and these examples may be separated by a distance of less than 200 micrometers.

This embodiment is obtained by the use of micro-machining techniques, for example techniques used in the semiconductor industry.

According to an embodiment, the two 3D capacitors are formed using at least one common manufacturing step.

This common manufacturing step may be a material deposition step, an etching step, a photolithography step, or any manufacturing step which allows parallel fabrication of two features respectively belonging to the two 3D capacitors.

By common manufacturing step, should be understood that a single step may allow forming a same feature in the two 3D capacitors.

According to a particular embodiment, the capacitor module has a plane of symmetry separating the two 3D capacitors.

It has been observed by the inventors of the present invention that having a capacitor module having a plane of symmetry ensures that the differential characteristic impedance of the device is well-controlled: there is no travel distance difference between the two capacitors for the signals travelling through the two capacitors.

According to a particular embodiment, the lines of the pair of differential transmission lines extend in a straight direction within the vicinity of the capacitor module.

Because of the use of the base on which the two 3D capacitors are supported, it is possible to use straight lines which do not have the turns, enlargements, and tapers required for soldering that are visible on the devices according to the prior art of FIGS. 1A and 1B. For example, lines which extend in a straight direction may have two edges which remain parallel within this vicinity.

The person skilled in the art will understand what is meant by within the vicinity of the capacitor module. By way of example, within the vicinity means within a distance which is less than several millimeters, for example less than 500 micrometers, or less than 1 millimeter, or less than 5 millimeters, or less than 10 millimeters.

According to a particular embodiment, the base comprises an insulating region separating the two 3D capacitors.

The material comprised in this insulating region may be chosen so as to have insulating and/or dielectric characteristics, in order to better control the differential characteristic impedance within the capacitor module. For example, silicon may be used, especially un-doped or low doped silicon (close to intrinsic).

According to a particular embodiment, the base comprises a semi-conductor material, each 3D capacitor comprising at least one electrode comprising a semi-conductor material structure formed in the shape of trenches, holes, or pillars, a dielectric layer arranged in a conformal manner on the semiconductor material structure, and another electrode arranged in a conformal manner on the dielectric layer.

By way of example, this embodiment may implement, for each capacitor, a structure as disclosed in document WO2007125510.

In this embodiment, the walls of the trenches, holes, or pillars may be doped so as to form an electrode of each capacitor, and un-doped or low doped silicon may be used to isolate the two 3D capacitors.

According to a particular embodiment, the base comprises a material having a porous regions for each 3D capacitor in which pores extend in a first direction (from a face of the layer comprising the material, the first direction being for example orthogonal to this face), each 3D capacitor comprising an electrode arranged in a conformal manner at least inside the pores of the porous region of the capacitor, a dielectric layer arranged in a conformal manner at least inside the pores of the porous region of the capacitor on the electrode, and another electrode arranged in a conformal manner at least inside the pores of the porous region on the dielectric layer.

This embodiment may be implemented using the method disclosed in document WO 2015/063420 to produce the two 3D capacitors. In this document, the pores are made in porous anodic alumina.

According to a particular embodiment, the base further comprises a semi-conductor region placed below a region comprising the material having porous regions.

For example, this semiconductor region may comprise silicon. The invention is not limited to the use of semiconductor substrates, and the 3D capacitors of this embodiment may be formed on various substrates such as glass substrates or above integrated circuits.

According to a particular embodiment, the board comprises a face supporting the pair of transmission lines, the capacitor module being connected on the face of the board.

It should be noted that the invention is not limited to a connection of the capacitor module on a face of the board, but also concerns devices in which the capacitor module is, for example, embedded in the board.

The pair of transmission lines may be printed on this face of the board in this embodiment, and the capacitor module is then placed close to the lines, which limits the travel distance of the signal from the lines to the capacitor and back.

According to a particular embodiment, the two 3D capacitors are supported by a side of the base facing the face of the board.

This particular embodiment allows the two 3D capacitors to be as close as possible to the pair of lines. Consequently, the presence of the 3D capacitors barely affects the propagation of the signal in the lines and the differential characteristic impedance is well controlled. Again, by supported by, what is meant is that the two 3D capacitors can be on this side of the base or can come out on this side of the base if they are made in the base.

According to a particular embodiment, the two capacitor terminals respectively connected to the two line terminals of one line of the pair of transmission lines using conductive bumps.

The use of conductive bumps allows using the technique known to the person skilled in the art as flip chip. This technique facilitates the reduction of the surface area occupancy on the board with respect to standard soldering pads.

Alternatively, wires may be used to connect the capacitor terminals.

According to a particular embodiment, the face of the board supports a plurality of pairs of said differential transmission lines, and wherein the capacitor module comprises, for each pair of differential transmission lines, two of said 3D capacitors placed on the base having two capacitor terminals connected respectively to two terminals of a line of a pair from the plurality of pairs.

In this particular embodiment, all the pairs of differential transmission lines may be parallel and straight at least in the vicinity of the capacitor module (i.e. within a distance which is substantially the width of the capacitor module).

Also, preferably, all the 3D capacitors are all oriented in the same direction and aligned in a direction which is substantially orthogonal with the general direction of the pairs of differential transmission lines.

The invention also provides a communication module comprising the electronic device as defined above.

This communication module may be, for example, an optical communication module, or any communication module requiring the use of differential transmission lines.

The invention also provides a method for manufacturing an electronic device comprising: obtaining a board equipped with a pair of differential transmission lines, each line of the pair having an opening extending between two line terminals; obtaining a capacitor module comprising a base and two 3D capacitors supported by the base, each 3D capacitor comprising two capacitor terminals; and connecting respectively the two capacitor terminals of each capacitor to the two line terminals.

This method may be adapted to manufacture any one of the different embodiments of the device as defined above.

According to a particular embodiment, the electrodes of the 3D capacitors are formed using a manufacturing process chosen to obtain 3D structures having dimensions smaller than 200 micrometers between two parallel portions.

According to a particular embodiment, the method comprises at least one common manufacturing step for forming the two 3D capacitors.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

We will now describe embodiments of electronic devices in which capacitors embedded in capacitor modules will be mounted on pairs of differential lines arranged on a board.

The electronic devices according to these embodiments can be used in any communication module which requires the use of differential lines (for example optical communication modules).

Figure 1A:
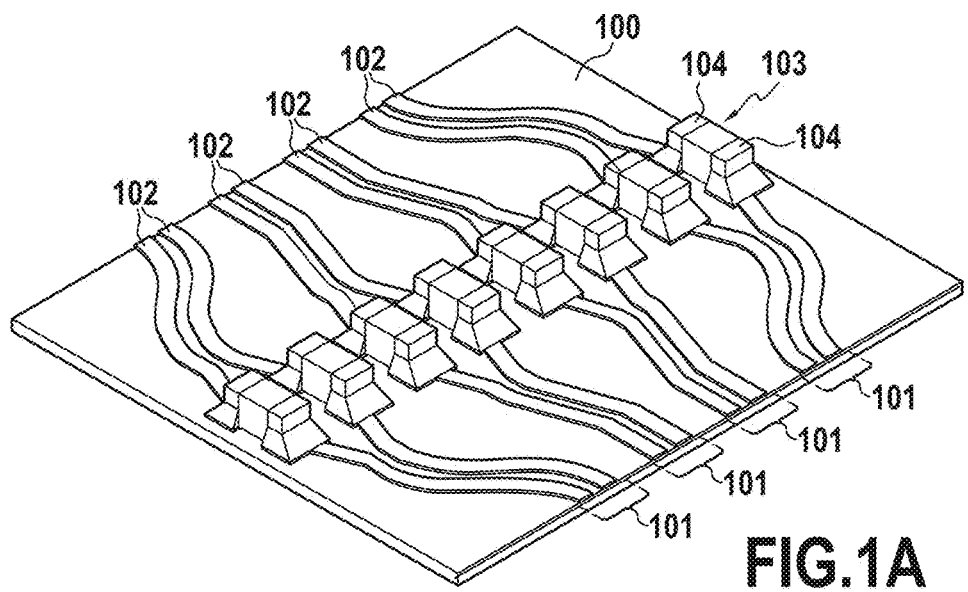
FIGS. 1A and 1B, already described, are example of devices according to the prior art.
Figure 1B:
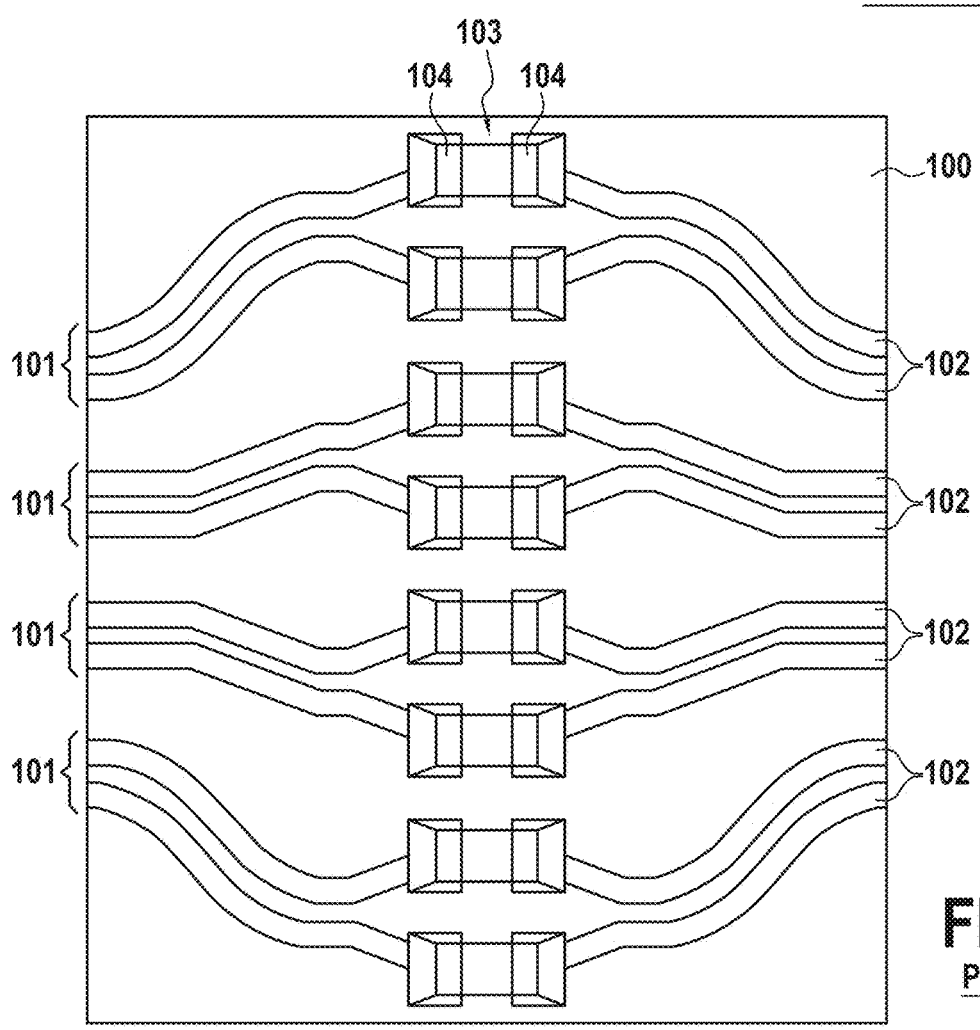
Figure 2A:
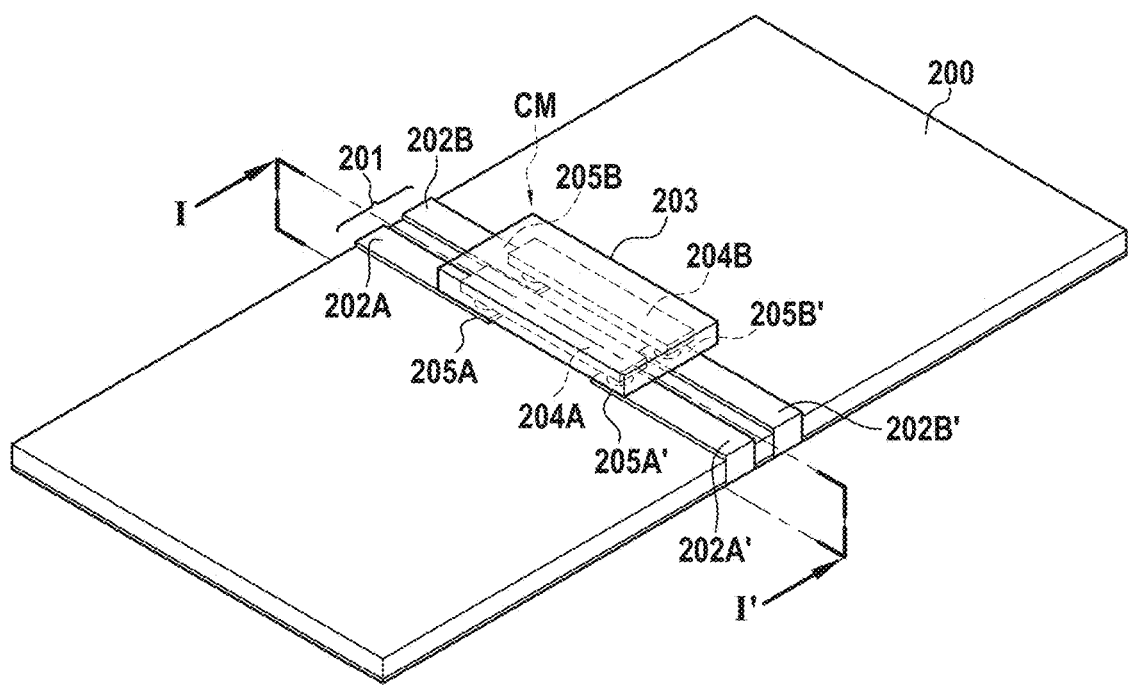
FIGS. 2A and 2B are schematic representations of an electronic device according to an example.

FIG. 2A is a perspective view of a device which includes a base 200 which is a PCB, typically comprising epoxy or ceramic.

On this base 200, a pair 201 of differential transmission lines has been printed (other alternatives are possible in which lines are etched/patterned). This pair of lines comprises four line segments shown on the visible portion of the device on the figure. These segments include segments 202A and 202A' of a first line, and segments 202B and 202B' of a second line. The two segments 202A and 202A' of the first line are separated by an opening which will be more visible on FIG. 2B described hereinafter. The two segments 202B and 202B' of the second line are separated by an opening which will be visible on FIG. 2B described hereinafter.

In order to block the DC component of the signal transmitted through the differential pair 201, a capacitor module CM is used.

The capacitor module CM comprises a first capacitor 204A and a second capacitor 204B.

As can be seen on the figure, the capacitors 204A and 204B are arranged so as to be as close as possible to the face of the board 200 which supports the pair of differential transmission lines 201. This allows maintaining the differential impedance as close as possible to the differential impedance of the lines.

The capacitors 204A and 204B are 3D capacitors and examples of 3D capacitors will be given hereinafter.

On this figure, line terminals 205A (at the end of segment 202A), 205A' (at the end of segment 202A'), 205B (at the end of segment 202B), 205B' (at the end of segment 202B') are also visible. These line terminals are separated by the above mentioned openings, and the capacitors 204A and 204B have capacitor terminals connected to these line terminals in a manner which will be described more precisely in reference to FIG. 2B.

Figure 2B:
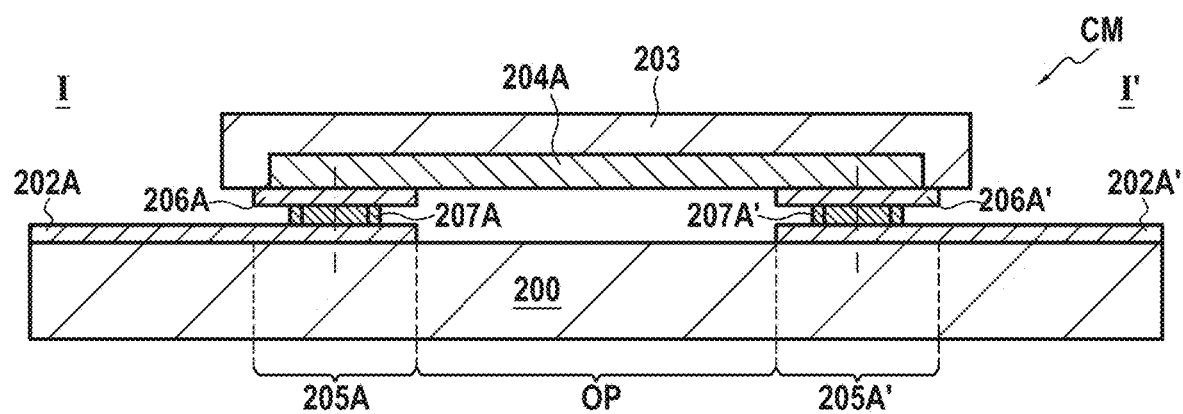

FIG. 2B is a cross section along the plane I-I' visible on FIG. 2A. This figure shows how capacitor 204A is arranged close to the board 200 as it is arranged on the side of the base which faces the face of the board supporting the pair of differential lines 201.

On this figure, the opening OP is visible between the line terminal 205A and the line terminal 205A'.

This figure also shows that the capacitor module CM comprises capacitor terminals 206A and 206A' which were not visible in the perspective view of FIG. 2A. Conductive bumps 207A and 207A' are also shown forming electrical contacts respectively between the capacitor terminal 206A and the line terminal 205A, and between the capacitor terminal 206A' and the line terminal 205A'. The flip chip method is used to assemble the capacitor module CM with the line terminals.

In the illustrated example, there is one conductive bump per capacitor electrode: there are four bumps for the capacitor module CM. This facilitates placing the capacitor module CM and prevents any tilting from occurring when the device is placed. Consequently, a good differential characteristic impedance is obtained and the propagation of the signal is barely affected.

Also, preferably, the conductive bumps have substantially the same shape as the line terminals and the capacitor terminals; this ensures a good control of the differential characteristic impedance.

It should be noted that the capacitor module of FIGS. 2A and 2B presents a plane of symmetry which goes through the capacitor module CM between the two capacitors.

Figure 3:
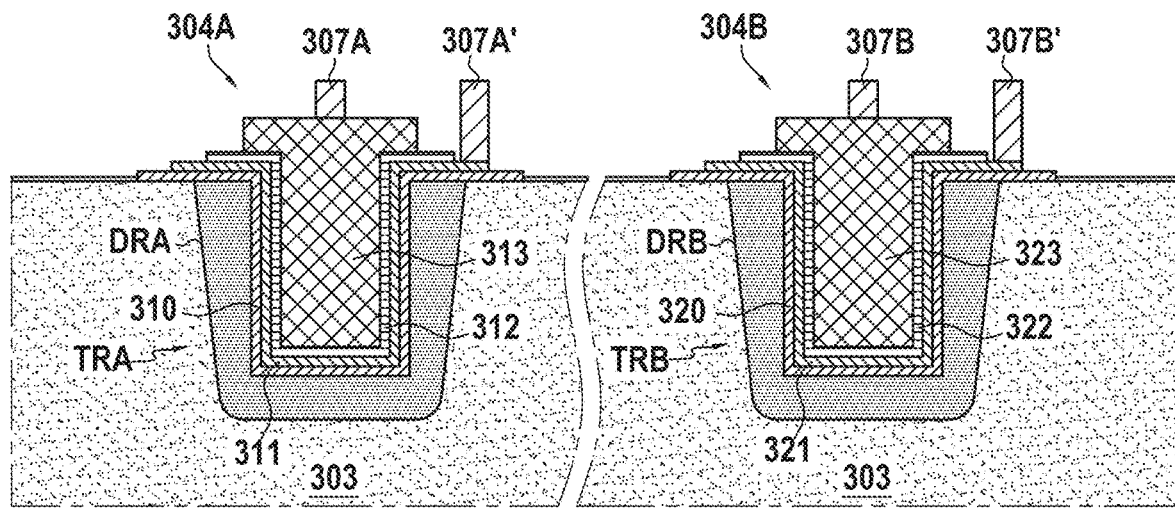
FIG. 3 is an example of a capacitor module wherein trenches are used.

FIG. 3 shows two 3D capacitors formed in a capacitor module CM' which could be used as the capacitor module CM in the embodiment of FIGS. 2A and 2B.

The capacitor module CM' comprises a base 303 which is a semi-conductor substrate comprising silicon, gallium arsenide, or even gallium nitride.

Two trenches TRA and TRB have been formed in the base 303. The walls of these two trenches may be doped (represented with doped regions DRA and DRB on the figure) so as to be conductive and behave as a capacitor electrode and more precisely a functional capacitor electrode.

In order to form a first 3D capacitor 304A, the trench TRA is filled with a dielectric layer 310, a first conductive layer 311, a second dielectric layer 312, and a second conductive layer 313.

A second 3D capacitor 304 is formed by filling the trench TRB with a dielectric layer 320, a first conductive layer 321, a second dielectric layer 322, and a second conductive layer 323.

The person skilled in the art will understand that the structures obtained are a MIMIM structures: Metal-Insulator-Metal-Insulator-Metal structures, which allow parallelizing two capacitors to obtain a single capacitor with increased capacitance. It should be noted that all the capacitor modules described herein are can be formed using MIM or MIMIM structures. Also, on the illustrated example, the interconnections between the electrodes of the capacitors are not fully represented for the sake of simplicity.

It should be noted that forming the two 3D capacitors 304A and 304B may be done using common manufacturing steps.

For example, forming the two trenches TRA and TRB may be done simultaneously in a single step, depositing the dielectric layers 310 and 320 may be done simultaneously in a single step, depositing the conductive layers 311 and 321 may be done simultaneously in a single step, depositing the dielectric layers 312 and 322 may be done simultaneously in a single step, and depositing the dielectric layers 313 and 323 may be done simultaneously in a single step.

It should be noted that this use of a common step ensures that the resulting features will have very similar properties in terms of dimensions and material, which will then turn to a good control of the differential characteristic impedance: the device is well balanced.

For accessing the electrodes of the capacitors, terminals 307A, 307A', 307B, and 307B' are respectively formed so as to obtain connections with layers 313, 311, 323, and 321. Although not shown on the figure, the doped regions DRA and DRB will be connected respectively with layers 313 and 323 to form parallel capacitors.

In the illustrated example, the trenches TRA and TRB may have a depth of less than 200 micrometers and a width of less than 10 micrometers.

The invention is however not limited to trenches and also covers the use of holes, pillars, etc.

It should be noted that in the illustrated example, the two 3D capacitors are formed in a same silicon substrate which has a very low conductivity and may considered to be insulating by the person skilled in the art: the relative permittivity of silicon, having a value of 11.68, is acceptable to set the characteristic impedance.

Figure 4:
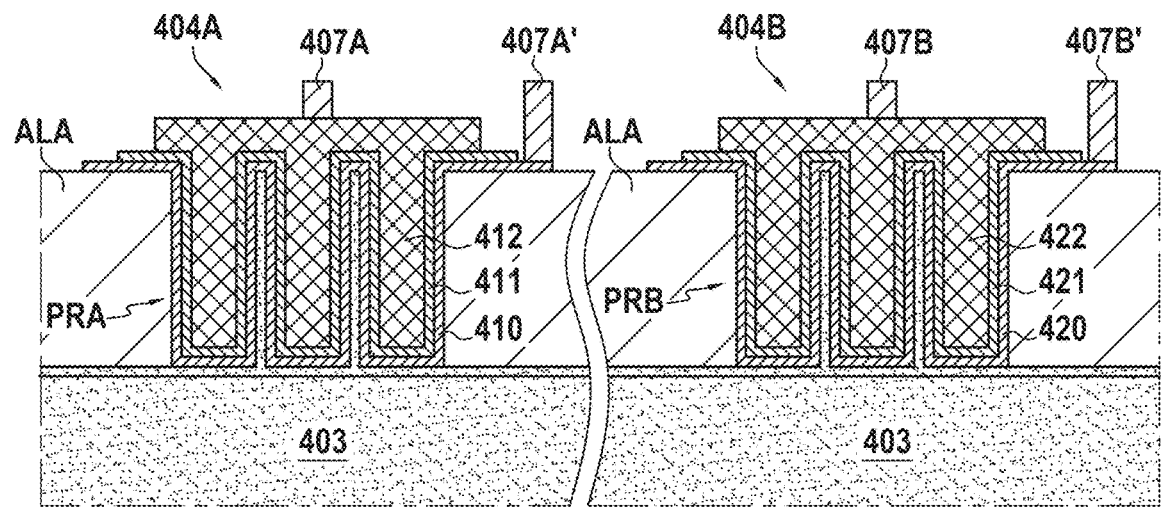
FIG. 4 is an example of a capacitor module wherein a porous region is used.

FIG. 4 shows another example of two 3D capacitors formed in a capacitor module CM" which could be used as the capacitor module CM in the embodiment of FIGS. 2A and 2B.

The capacitor module CM" comprises a base 403 which may include a semiconductor material. For example, the base may include active components formed in silicon and may be a full integrated circuit, or a silicon substrate without any components.

Two porous regions PRA and PRB have been formed above the base 403 in an alumina layer ALA. The two porous regions are porous anodic aluminum oxide (AAO), or any other material having pores extending from a face.

In order to form a first 3D capacitor 404A, the porous region is filled with a first conductive layer 410, a dielectric layer 411, and a second conductive layer 412.

In order to form a second 3D capacitor 404B, the porous region is filled with a first conductive layer 420, a dielectric layer 421, and a second conductive layer 422.

The person skilled in the art will understand that the structures obtained are a MIM structures: Metal-Insulator-Metal structures. However, MIMIM structures may also be used in porous regions.

It should be noted that forming the two 3D capacitors 404A and 404B may be done using common manufacturing steps.

For example, forming the two porous regions PRA and PRB may be done simultaneously in a single step, depositing the conductive layers 410 and 420 may be done simultaneously in a single step, depositing the dielectric layers 411 and 421 may be done simultaneously in a single step, and depositing the conductive layers 412 and 422 may be done simultaneously in a single step.

For accessing the electrodes of the capacitors, terminals 407A, 407A', 407B, and 407B' are respectively formed so as to obtain connections with layers 412, 410, 422, and 420.

In the illustrated example, the porous region may have a depth of a few micrometers to several tens of micrometers.

It should be noted that in the illustrated example, the two 3D capacitors are insulated from each other by the alumina of the alumina layer ALA.

Figure 5A:
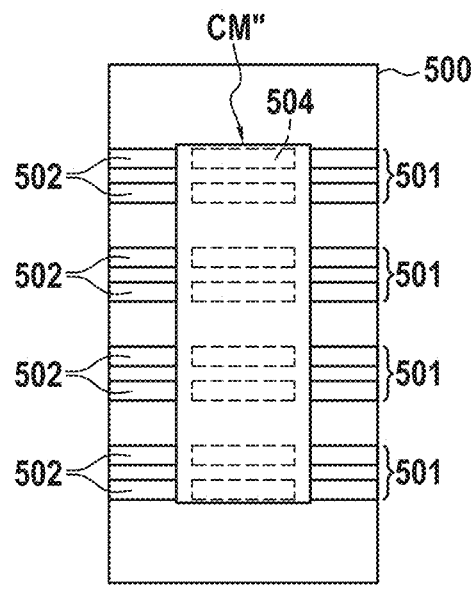
FIGS. 5A and 5B are examples in which there are multiple pairs of differential transmission lines.

FIG. 5A is a top view of an electronic device comprising a board 500 supporting a plurality of pairs of differential transmission lines 501 (similar to the pairs 201 described in reference to FIGS. 2A and 2B) each comprising line segments 502.

The line segments are all straight in the portion of the device visible on the figure, with no shoulder introducing a length difference between two lines of a pair.

The electronic device further comprises a capacitor module CM''' comprising two capacitors 504 for each pair connected to the lines in a manner which is substantially the same as capacitors 204A and 204B of FIGS. 2A and 2B.

Figure 5B:
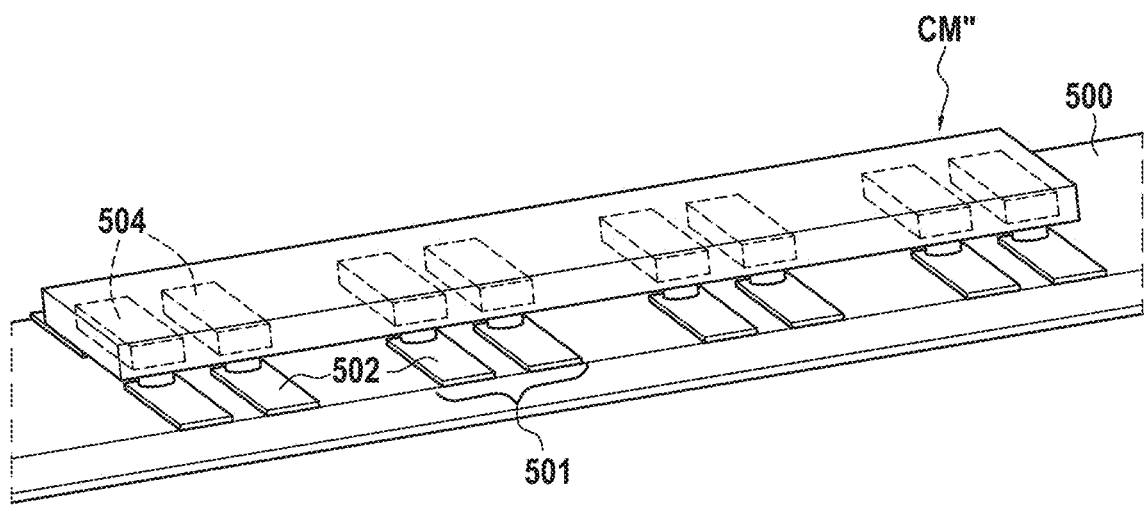

FIG. 5B is a perspective view of the device of FIG. 5A.

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. An electronic device comprising:
   a board comprising a face supporting a pair of differential transmission lines, each line of the pair having an opening extending between two line terminals; and a capacitor module comprising:
   a base; and
   two 3D capacitors supported by a side of the base facing the face of the board supporting the pair of differential transmission lines, each 3D capacitor comprising two capacitor terminals respectively connected to the two line terminals of one line of the pair of transmission lines so as to be as close as possible to the face of the board supporting the pair of differential transmission lines.

2. The device of claim 1, wherein the 3D capacitors comprise electrodes arranged so as to form 3D structures having dimensions smaller than 200 micrometers between two parallel portions.

3. The device of claim 1, wherein the two 3D capacitors are formed using at least one common manufacturing step.

4. The device of claim 1, wherein the capacitor module has a plane of symmetry separating the two 3D capacitors.

5. The device of claim 1, wherein the lines of the pair of differential transmission lines extend in a straight direction within a vicinity of the capacitor module.

6. The device of claim 1, wherein the base comprises an insulating region separating the two 3D capacitors.

7. The device of claim 1, wherein the base comprises a semiconductor material, and each 3D capacitor includes at least one electrode comprising a semiconductor material structure formed in the shape of trenches, holes, or pillars, a dielectric layer arranged in a conformal manner on the semiconductor material structure, and another electrode arranged in a conformal manner on the dielectric layer.

8. The device of claim 1, wherein the base comprises a material having a porous regions for each 3D capacitor in which pores extend in a first direction, each 3D capacitor comprising an electrode arranged in a conformal manner at least inside the pores of the porous region of the capacitor, a dielectric layer arranged in a conformal manner at least inside the pores of the porous region of the capacitor on the electrode, and another electrode arranged in a conformal manner at least inside the pores of the porous region on the dielectric layer.

9. The device of claim 8, in which the base further comprises a semi-conductor region placed below a region comprising the material having porous regions.

10. The device of claim 1, wherein the two capacitor terminals are respectively connected to the two line terminals of one line of the pair of transmission lines using conductive bumps.

11. The device of claim 1, wherein the face of the board supports a plurality of pairs of said differential transmission lines, and wherein the capacitor module comprises, for each pair of differential transmission lines, two of said 3D capacitors placed on the base having two capacitor terminals connected respectively to two terminals of a line of a pair from the plurality of pairs.

12. A communication module comprising the electronic device according to claim 1.

13. A method for manufacturing an electronic device, the method comprising:
   obtaining a board comprising a face supporting a pair of differential transmission lines, each line of the pair having an opening extending between two line terminals;
   obtaining a capacitor module comprising a base and two 3D capacitors supported by a side of the base facing the face of the board supporting the pair of differential transmission lines, each 3D capacitor comprising two capacitor terminals; and
   connecting respectively the two capacitor terminals of each capacitor to the two line terminals so as to be as close as possible to the face of the board supporting the pair of differential transmission lines.

14. The method of claim 13, wherein the electrodes of the 3D capacitors are formed using a manufacturing process chosen to obtain 3D structures having dimensions smaller than 200 micrometers between two parallel portions.

15. The method of claim 13, comprising at least one common manufacturing step for forming the two 3D capacitors.

* * * * *